United States Patent [19]

No

[11] Patent Number: 5,050,191
[45] Date of Patent: Sep. 17, 1991

[54] SYNCHRONIZATION DETECTOR USING PATH METRIC AND BRANCH METRIC VALUES OF A VITERBI DECODER

[75] Inventor: Jong-Seon No, Germantown, Md.

[73] Assignee: Hughes Aircraft Company, Los Angeles, Calif.

[21] Appl. No.: 427,167

[22] Filed: Oct. 24, 1989

[51] Int. Cl.$^5$ ............................................. H04L 27/06
[52] U.S. Cl. ..................................... 375/94; 375/114; 371/43; 371/46
[58] Field of Search ........................... 375/94, 39, 114; 371/43, 46, 47.1

[56] References Cited

U.S. PATENT DOCUMENTS 4,601,046 7/1986 Halpern et al. ....................... 375/38
4,641,327 2/1987 Wei ...................................... 375/114

Primary Examiner—Douglas W. Olms
Assistant Examiner—Ralph Smith
Attorney, Agent, or Firm—Steven M. Mitchell; Robert A. Westerlund; Wanda K. Denson-Low

[57] ABSTRACT

Synchronization conditions of a Viterbi decoder are detected using the differences between minimum branch metrics and corresponding minimum path metrics. In accordance with the invention, zero differences are monitored, non-zero differences are monitored and weighted, and the monitoring is used to detect in-synchronization or out-of-synchronization condition of the decoder. More particularly, the differences are non-linearly mapped (F3) into a value in a first set for some differences or a value in a second set for the other differences. In accordance with the method of synchronization detection, an accumulator, counter or indicator is initialized (F1) to an initial value and as the mapped values are produced in sequence, they are sequentially summed (F5) with the value of the accumulator, counter or indicator so as to continually update the sum. The value of the accumulator, counter or indicator is compared to an out-of-synchronization threshold and to an in-synchronization threshold (F6, F7). Each time the value of the counter, accumulator or indicator reaches or exceeds the value of the out-of-synchronization threshold, an out-of-synchronization status is declared (F9) and the counter, accumulator or indicator is returned to its initialized value, and the process continues.

16 Claims, 6 Drawing Sheets

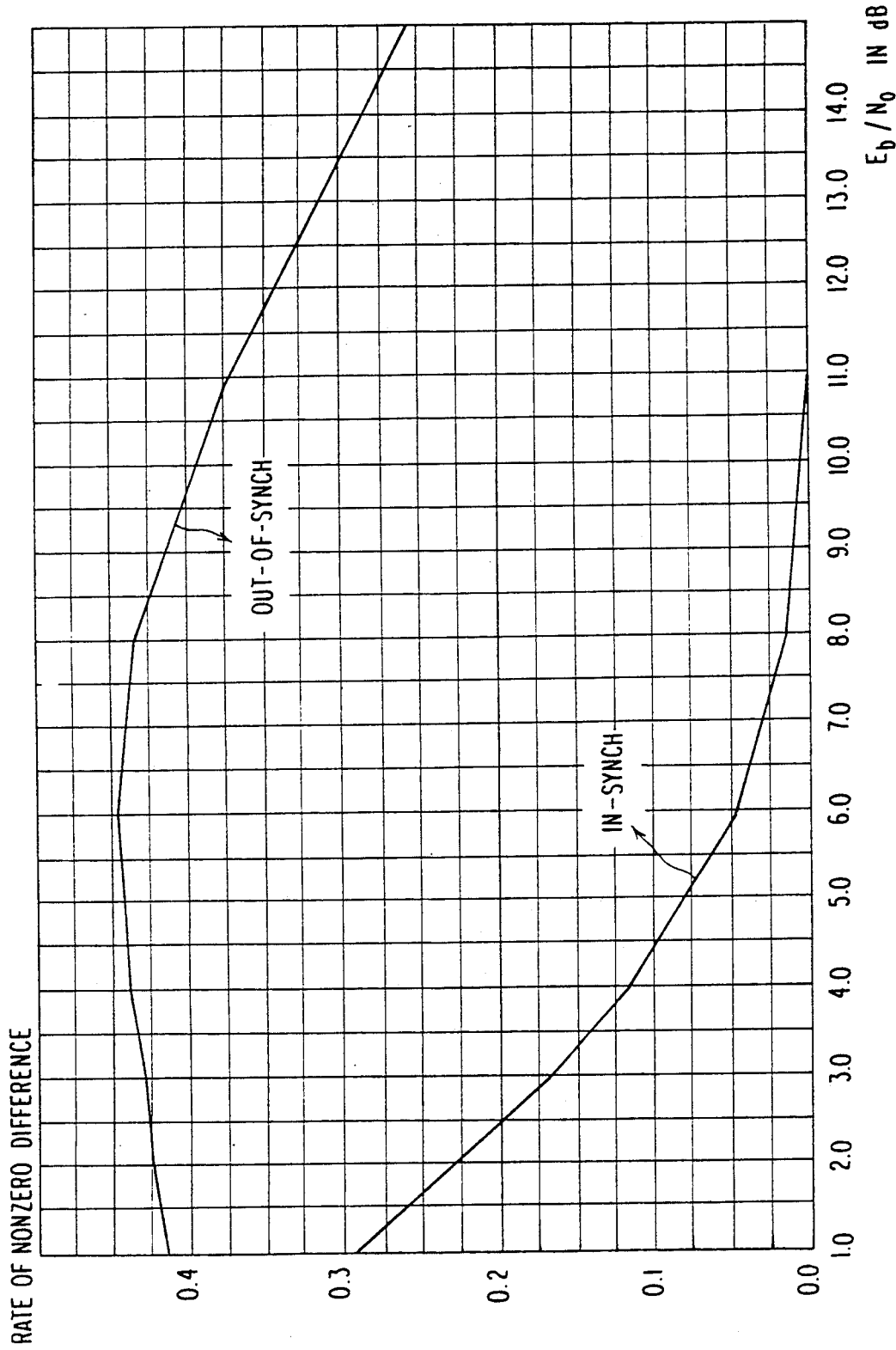

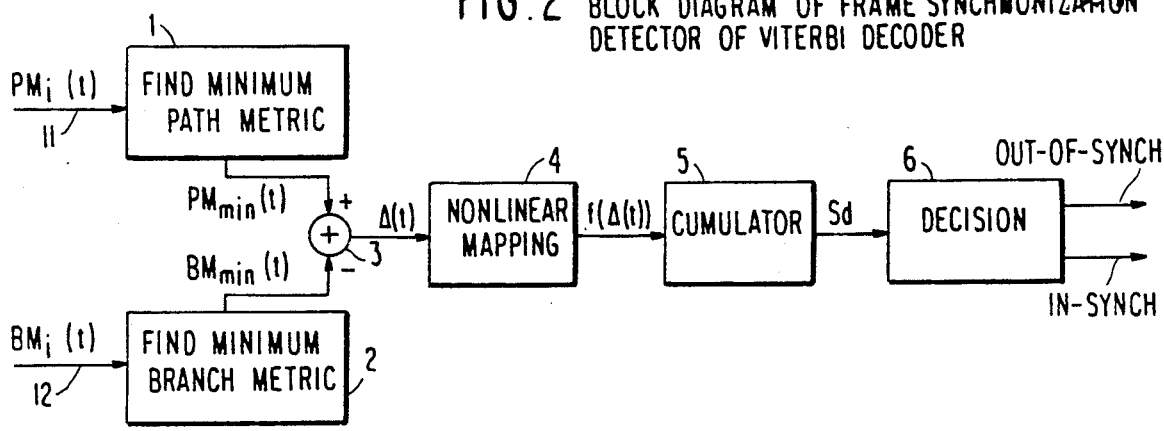
FIG. 2 BLOCK DIAGRAM OF FRAME SYNCHRONIZATION DETECTOR OF VITERBI DECODER
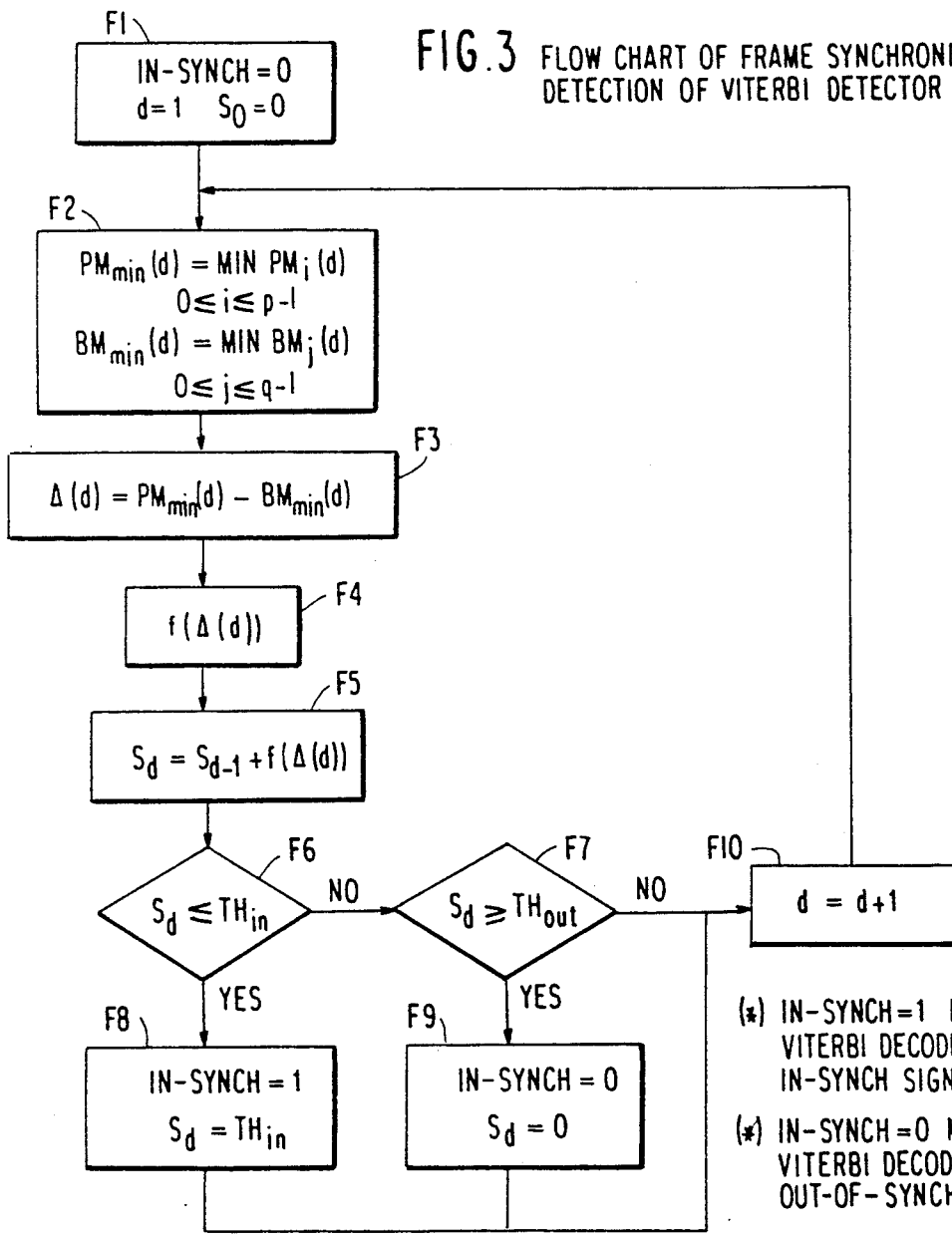
FIG. 3 FLOW CHART OF FRAME SYNCHRONIZATION DETECTION OF VITERBI DETECTOR
(∗) IN-SYNCH=1 MEANS THAT VITERBI DECODER ISSUES IN-SYNCH SIGNAL
(∗) IN-SYNCH=0 MEANS THAT VITERBI DECODER ISSUES OUT-OF-SYNCH SIGNAL

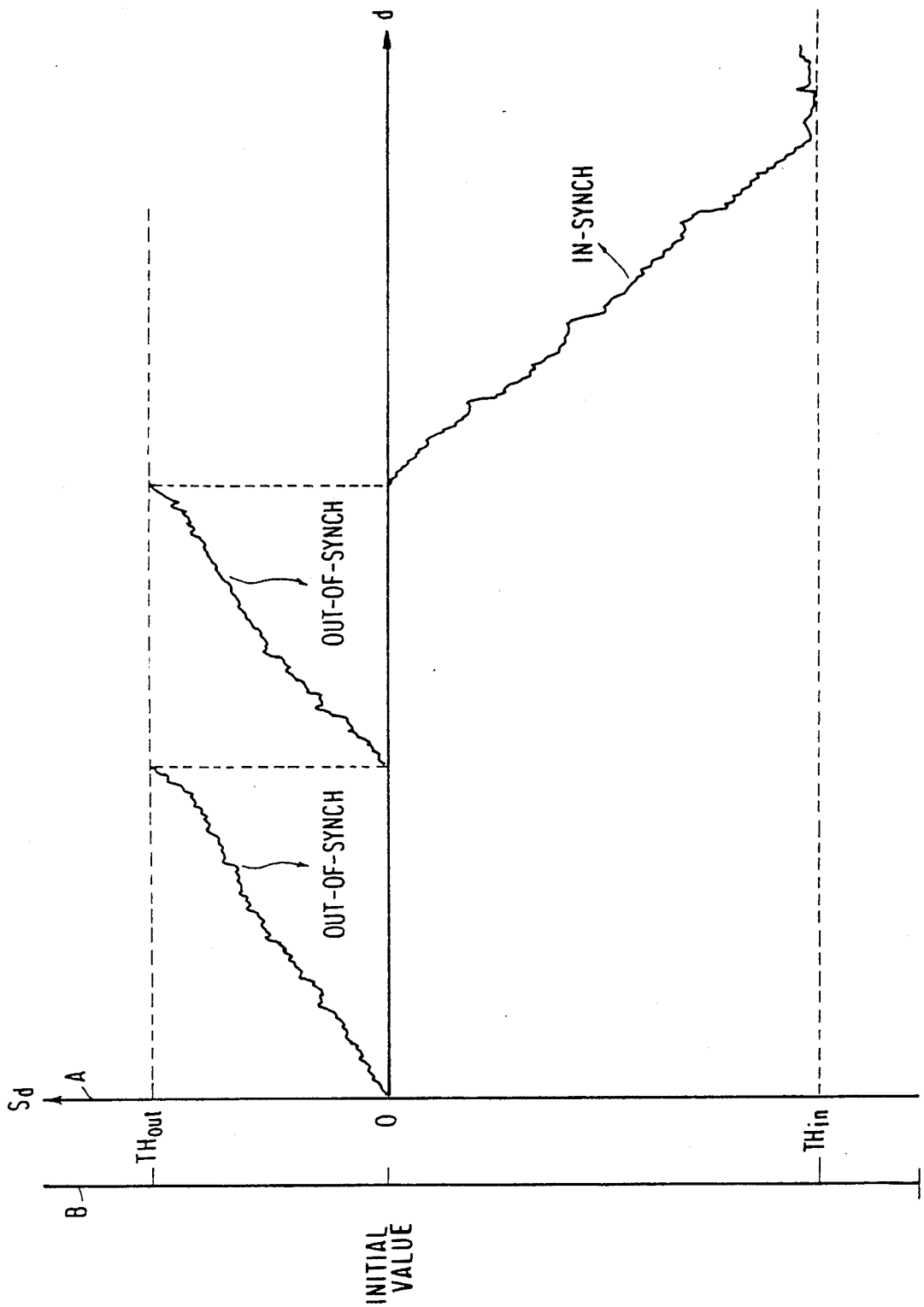

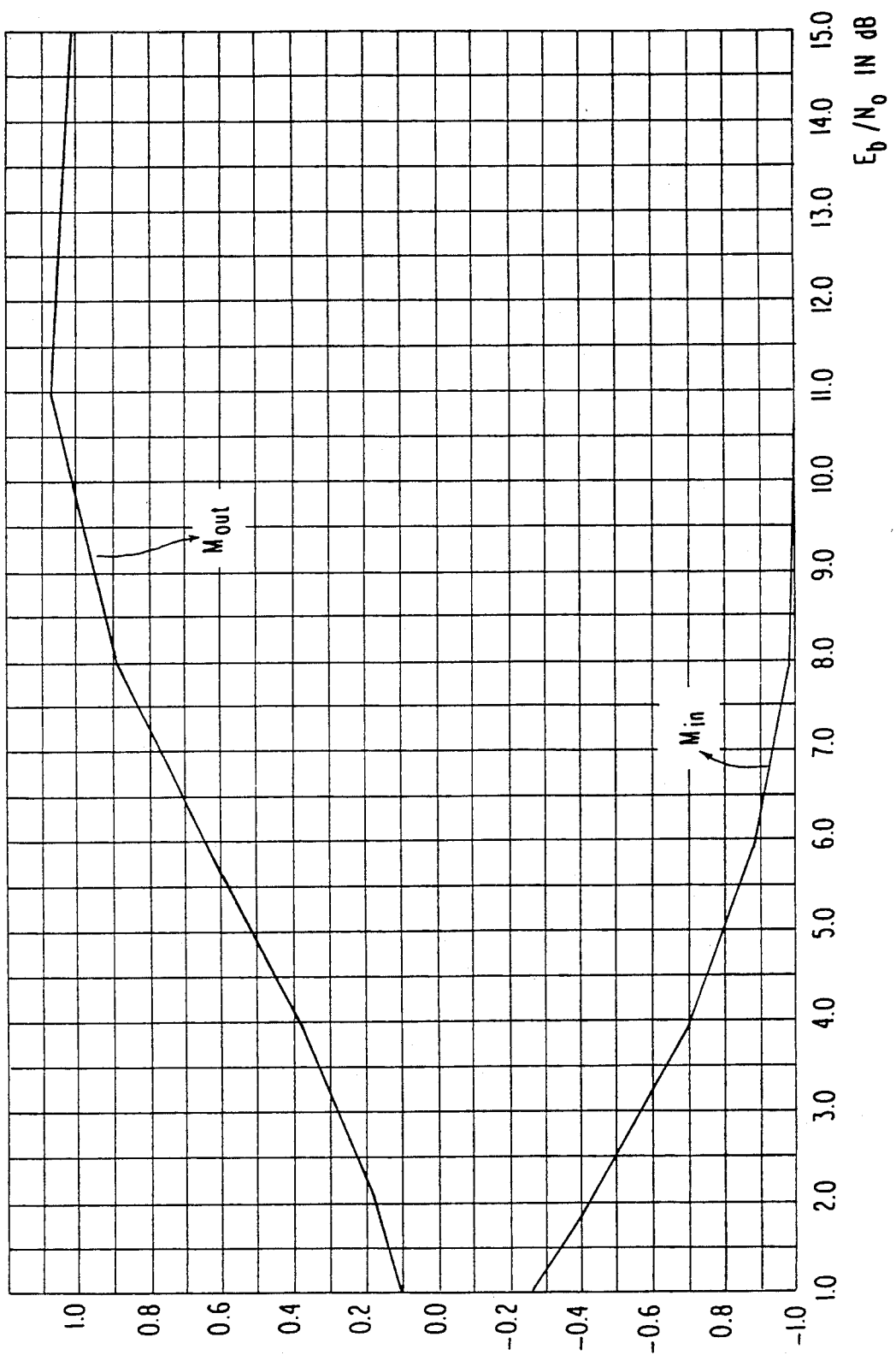
FIG. 5 MEAN VALUES OF $f(\Delta(t))$ OF RATE 1/2 VITERBI DECODER OF GENERATOR POLYNOMIALS (171,133)

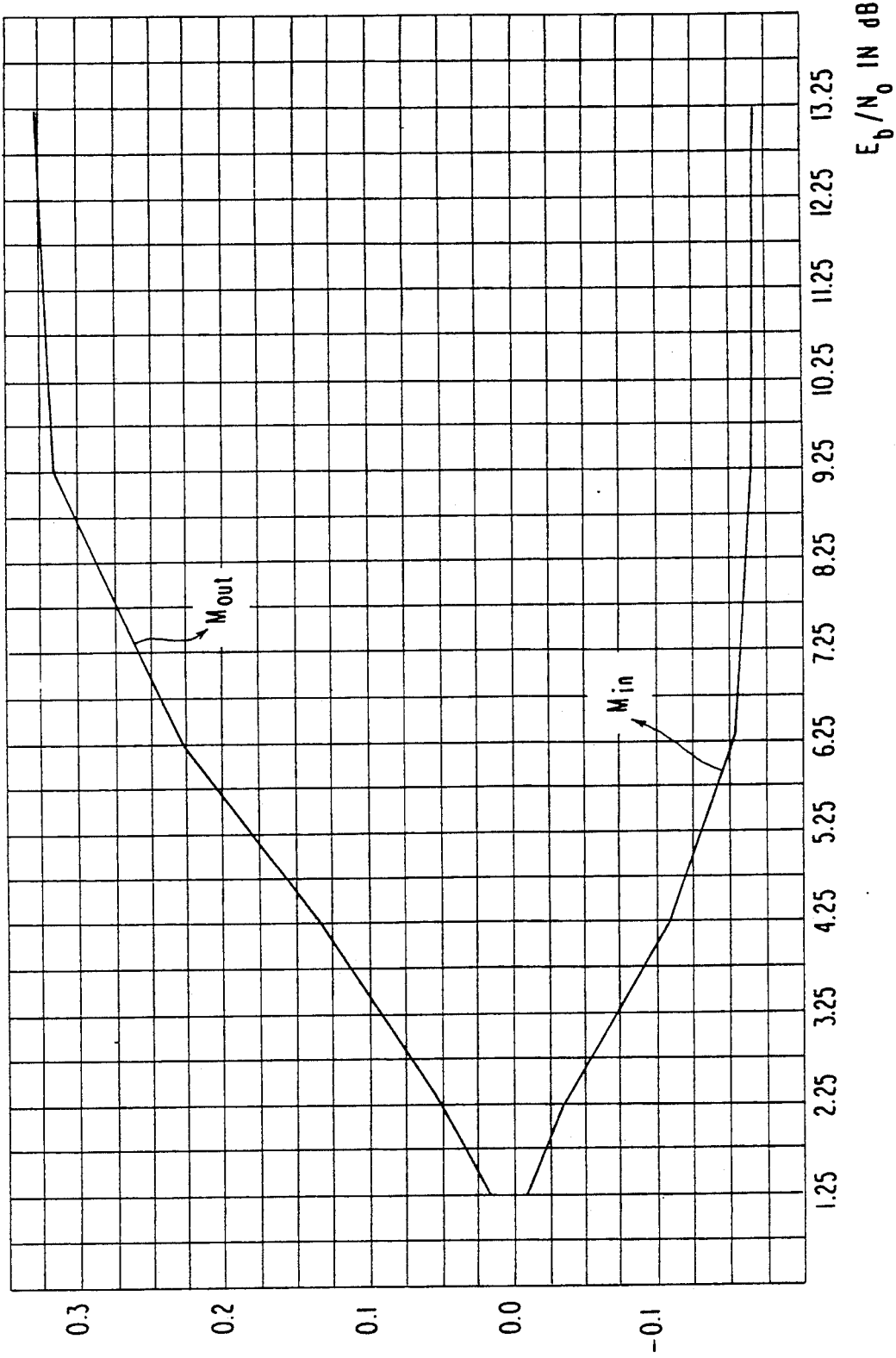
FIG. 6 MEAN VALUES OF $f(\Delta(t))$ OF VITERBI DECODER FOR RATE 3/4 PUNCTURED CONVOLUTIONAL CODE

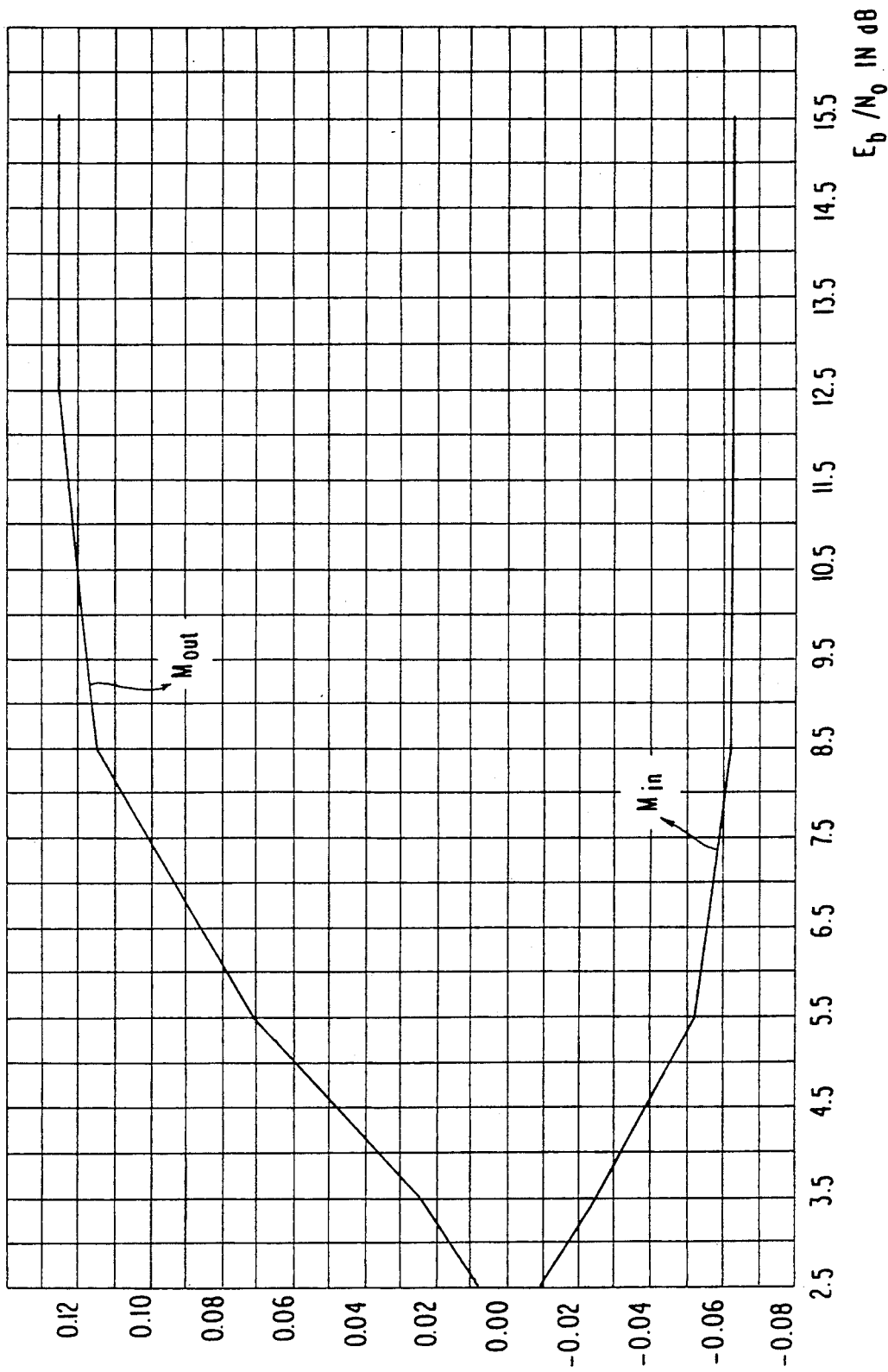
FIG.7 MEAN VALUES OF $f(\Delta(t))$ OF VITERBI DECODER OF RATE 7/8 PUNCTURED CONVOLUTIONAL CODE

ND BRANCH METRIC VALUES OF A
VITERBI DECODER

DESCRIPTION

1. Technical Field

The invention relates to detection of synchronization or lack of synchronization in Viterbi decoders.

2. Background Art

Convolutional codes are widely used for error correction purposes in communications systems. While convolutional coding is used to a large extent in satellite communications, it is also used in a variety of other communication fields. Basically a convolutional code adds redundancy to the information to be transmitted so that, using the redundant information at the receiver, there is the capability of correcting errors occurring by reason of noise and other impairments in the transmission process. While there are many techniques for decoding convolutional codes, an optimal decoder is known as the Viterbi decoder. See for example Forney, "The Viterbi Algorithm", *Proceedings of the IEEE*, Vol. 61, pp. 268-278, March 1973 and Heller, "Viterbi Decoding for Satellite and Space Communication", *IEEE Transactions on Communication Technology*, Vol. COM-19, pp. 835-848, October 1971.

In decoding in general as well as in Viterbi decoding, an important requirement is the need for frame synchronization. Synchronization is essential for proper decoding. Decoding requires grouping the received symbols into frames, and synchronization is the process by which the frame delimiters are determined since frame delimiters are not explicitly transmitted.

Synchronization in Viterbi decoders is addressed by Yasuda U.S. Pat. Nos. 4,527,279 and 4,578,800; Wei U.S. Pat. No. 4,641,327 and Gordon U.S. Pat. No. 4,675,871. Other aspects of Viterbi decoders are addressed in Acampora U.S. Pat. No. 4,087,787; Shenoy U.S. Pat. No. 4,583,078; Otani U.S. Pat. No. 4,606,027; Martinez U.S. Pat. No. 4,709,377; Heichler U.S. Pat. No. 4,757,506 and Yamashita U.S. Pat. No. 4,777,636.

In connection with synchronization techniques, of the four techniques referred to above, the technique described by Wei (U.S. Pat. No. 4,641,327) appears to be superior, although it too has its deficiencies.

In the course of decoding by the use of the Viterbi algorithm, for every group of received symbols, the Viterbi decoder calculates q branch metrics ($BM_0$-$BM_{q-1}$) and P path metrics ($PM_0$-$PM_{P-1}$). These values are employed in the Viterbi decoder. Of the group of path metrics, the lowest path metric (the minimum path metric) is selected and the entire set of path metrics is normalized in order to retain the differences between the various path metrics and to reduce the minimum path metric to zero. In other words for a set of $PM_0$-$PM_{P-1}$, we produce a normalized set of path metrics $PM'_0$-$PM'_{P-1}$ where any $PM'_i = (PM_i - PM_{min})$.

The number of symbols in any group of symbols which produce the branch metrics and path metrics depends on the parameters of the code being employed. In a so-called rate one-half code, there are two symbols per group; in a rate three-fourths code, there are four symbols per group; etc.

The synchronization technique described by Wei selects the minimum branch metric and the minimum (prior to normalization) path metric and uses these values to detect loss of synchronization. When loss of synchronization is detected the receiver is informed to slip (either backward or forward) in order to search for the beginning of the frame. In rate one-half codes, the search is relatively simple since if the receiver was out-of-sync, a 1-bit shift should produce synchronization. In other codes the search may be more extended.

The technique which Wei uses, employing the minimum branch metric and the (un-normalized) minimum path metric begins by determining the difference between the minimum branch metric and path metric. The difference is input to a counter. Basically, the counter is used to count the rate of occurrences of non-zero differences. If the rate of non-zero occurrences exceeds a threshold, then in the technique described by Wei, an out-of-synchronization condition is declared.

One technique Wei describes to implement this comparison is by initializing the counter to zero, counting for 100 groups the number of non-zero differences, i.e. the counter is incremented by unity for every non-zero difference. The sum is then divided by 100 and if the ratio is greater than 0.4 for three successive blocks of 100 decision, then loss of synchronization is declared.

A problem with this technique is shown in FIG. 1. FIG. 1 plots, for a rate one-half convolutional code of generator polynomials (171, 133), and employing the Wei technique, the rate of non-zero differences vs. signal energy per bit/noise power spectral density ratio ($E_b/N_o$) for both in-synch and out-of-synch conditions. Referring to FIG. 1, it will be seen that for high $E_b/N_o$ and an out-of-synch condition, i.e. beyond 9.5 dB, the rate of non-zero occurrences drops below 0.4 and hence while the decoder is out of synchronization, the Wei technique would nevertheless declare an in-synchronization condition. Furthermore, FIG. 1 makes it apparent that there is no fixed threshold which can be used to differentiate the in-synchronization condition from the out-of-synchronization condition. This is for the reason that the rate of non-zero differences for low $E_b/N_o$ when the decoder is in synchronization overlaps the rate of non-zero differences for high $E_b/N_o$ when the decoder is out of synchronization.

Accordingly, it is an object of the present invention to provide a technique for reliably detecting the synchronization status of a Viterbi decoder. It is another object of the present invention to reliably detect synchronization status of a Viterbi decoder which is reliable over a wide range of $E_b/N_o$.

SUMMARY OF THE INVENTION

The invention provides for reliably detecting the synchronization status of a Viterbi decoder by using a sequence of differences between the minimum branch metric and the corresponding minimum (un-normalized) path metric. Any difference value is non-linearly mapped. In one embodiment of non-linear mapping for rate one-half convolutional code, a difference value of zero is mapped into a mapped value of magnitude unity and negative sign. Any other difference value is mapped into the corresponding value. In other words, a difference value of 2 corresponds to a mapped value of 2, and difference value of 5 corresponds to a mapped value of 5, etc. From the sequence of differences a sequence of mapped values is produced. An accumulator, counter, indicator or the like is initialized to an initial value and every mapped value of the sequence is summed with the accumulator or counter. Thus, the first time the accumulator or counter is referred to, after initialization to the initial value, the first mapped value is added (algebraically) to produce a sum. The next mapped value is also added (algebraically) to the sum to create an updated sum, and so on. Every sum is then compared to two different thresholds. The initial value, the value to which the counter or accumulator is initialized, is selected to lie between the two thresholds. If at any time the sum (the value of the counter or accumulator or indicator) reaches or exceeds a first threshold, an out-of-synchronization condition is declared. This out-of-synchronization declaration has two effects. In the first place, it is used at the receiver to initiate a search for synchronization by shifting the receiver's previous estimate of the frame termination. The out-of-synchronization declaration is also used to reset the sum (the quantity in the counter or accumulator or indicator) back to the initial value.

On the other hand, if the sum (the value in the counter or accumulator) drops below the second threshold, then an in-synchronization condition is declared. When an in-synchronization condition is declared, the sum (the value in the counter or accumulator or indicator) is clamped to the second threshold. In other words, the sum is not allowed to decrease in magnitude below the second threshold.

Accordingly, the invention provides, in a Viterbi decoder, a method of detecting synchronization status using a sequence of differences between minimum path metrics and corresponding minimum branch metrics, said method comprising the steps of:
a) non-linearly mapping each of said differences into either a first or a second set of mapped values to produce a sequence of mapped values, where a sign of a value in said first set is different from all signs of mapped values in said second set,
b) summing said sequence of mapped values to produce a sequence of sums, and
c) comparing each of said sums to a threshold to determine said synchronization status.

In accordance with another aspect, the invention provides, in a Viterbi decoder, a method of detecting synchronization status using a sequence of differences between minimum path metrics and corresponding minimum branch metrics, said method comprising the steps of:
a) non-linearly mapping each of said differences into either a first or a second set of mapped values to produce a sequence of mapped values, where a sign of a value in said first set of mapped values is different from all signs of mapped values in said second set,
b) summing said sequence of mapped values to produce a sequence of sums,
c) comparing each of said sums to a first and a second, different threshold to determine said synchronization status, and
d) declaring an out-of-synchronization status if any of said sums are greater than said first threshold or declaring an in-synchronization status if any of said sums are less than said second threshold.

In accordance with still another aspect, the invention provides, in a Viterbi decoder, a method of detecting synchronization status using a sequence of differences between minimum path metrics and corresponding minimum branch metrics, said method comprising the steps of:
a) monitoring occurrences of zero differences,
b) monitoring and weighting occurrences of non-zero differences, and
c) responsive to said monitoring of steps (a) and (b), determining in-synchronization or out-of-synchronization status.

BRIEF DESCRIPTION OF THE DRAWINGS

The invention will now be further described so as to enable those skilled in the art to practice the same in the following portions of the specification when taken in conjunction with the attached drawings in which:

FIG. 1 is a plot of rates of non-zero differences between minimum branch metrics and corresponding minimum path metrics for rate one-half convolutional code of generator polynomials (171, 133) using a prior art technique, plotted as a function of $E_b/N_o$;

FIG. 2 is a block diagram of the apparatus to implement the synchronization detection of the present invention;

FIG. 3 is a flow chart of the steps comprising the method of synchronization detection of the present invention;

FIG. 4 plots the parameter $S_d$ as a function of received bits illustrating the processing relative to the thresholds $TH_{out}$ and $TH_{in}$ and illustrating that the initial value or the value to which the sum $S_d$ is initialized, can either be selected as zero or some non-zero value, so long as the relationship between $TH_{in}$, $TH_{out}$ and the initial value are maintained;

FIG. 5 plots the mean value $M_{out}$ and $M_{in}$, corresponding to out-of-synchronization and in-synchronization conditions, for the rate one-half convolutional code of generator polynomials (171, 133), using the method of the present invention, as a function of $E_b/N_o$;

FIG. 6 is a plot similar to FIG. 5 for the rate ¾ punctured convolutional code derived from the code in FIG. 5; and FIG. 7 is a plot similar to FIGS. 5 and 6 for the rate ⅞ punctured convolutional code derived from the code in FIG. 5.

DETAILED DESCRIPTION OF PREFERRED EMBODIMENTS

FIG. 2 shows, in block diagram form, the synchronization method and apparatus of the present invention. As shown in FIG. 2, information is provided to the synchronization apparatus from the Viterbi decoder. This information includes, on path 11, a sequence of sets of path metrics ($PM_i(t)$), where i, for every frame, can vary from 0 to P−1. Also input, on line 12 from the Viterbi decoder, is a sequence of sets of branch metrics ($BM_i(t)$) for each frame, where i varies from 0 to q−1. For each set of path metrics, the element 1 determines the minimum path metric $PM_{min}(t)$. Element 2 finds, from each set of branch metrics, the minimum branch metric $BM_{min}(t)$. The summing device 3 produces the difference $\Delta(t)$. The differences produced by the summing device 3 are input in the same sequence as they are produced, to the non-linear mapping element 4. The non-linear mapping element 4 separates zero and non-zero differences. Zero differences are mapped into a first set with one sign (and one mapped value in the set). Non-zero differences are mapped into a second set all with signs different from the one sign. The second set has mapped values equal in magnitude to the non-zero difference. The output of the non-linear mapping element is the mapped value corresponding to the difference $\Delta(t)$, $f(\Delta(t))$. The mapped value is output from the non-linear mapping element 4 to an accumulator or summing device 5. For each mapped value provided by the non-linear mapping element, the summing device or accumulator 5 produces a sum $S_d$. The sum $S_d$ is input to the decision element 6. The other inputs to the decision element comprise the first and second thresholds $TH_{out}$ and $TH_{in}$. The decision device 6 compares the sum $S_d$ to the thresholds. If the sum $S_d$ exceeds the threshold $TH_{out}$, an out-of-synchronization status is declared. The out-of-synchronization status is used to alter the frame/bit sequencing in an attempt to acquire synchronization. Alternatively, if the sum $S_d$ is below the second threshold $TH_{in}$, then an in-synchronization condition is declared.

FIG. 3 shows the foregoing operations in more detail. As shown in FIG. 3, a parameter IN-SYNCH, reflects the in-synchronization or out-of-synchronization status of the decoder. When a decoder is in synchronization, the parameter IN-SYNCH is unity and otherwise, when the decoder is out of synchronization (or synchronization has not yet been detected), the parameter IN-SYNCH is zero. A second parameter employed in FIG. 3 is the parameter d which identifies the number of frames which have been processed by the synchronization detector. In other words, parameter d begins with the first frame, i.e. d=1, and is incremented unity for each frame which is processed by the decoder. The third parameter which is employed is the sum $S_d$. In the example shown in FIG. 1, the parameter $S_d$ is initialized at zero. As will be described below, this is not essential to the invention.

In the flow chart, the first function F1 is an initialization function, wherein the parameters IN-SYNCH and $S_d$ are set to zero, and d is initialized to unity. The first step, function F2, is performed when the path metric $PM_i(d)$ and branch metric $BM_i(d)$ are received. In function F2, the minimum path metric $PM_{min}(d)$ and the minimum branch metric $BM_{min}(d)$ are determined. With this input information, function F3 determines the difference $\Delta(d)$. With the output from function F3, function F4 maps the difference. This mapping is non-linear, since depending on the value of $\Delta$, it can be mapped into either a first set or a second set of mapped values. In the first set, a mapped value has a sign which is different from the sign of all of the mapped values in the second set. The second set has mapped values equal in magnitude to the non-zero difference. Once mapped, the mapped values are input to function F5 which performs the accumulation function. In other words, $S_d$ is computed as $S_{d-1}$ plus the mapped value from function F4. Function F6 then compares the sum $S_d$ to determine if it is lower than the in-synch threshold ($TH_{in}$). If this criterion is satisfied, then function F8 is performed to change the parameter In-Synch to unity, and at the same time, the sum $S_d$ is clamped to the threshold $TH_{in}$.

On the other hand, if the criterion of function F6 is not met, then function F7 is performed to see if the sum $S_d$ is greater than the threshold $TH_{out}$. If this criterion is satisfied, then function F9 is performed. In function F9, the parameter In-Synch is set to zero and the sum $S_d$ is set to the initialized value. If neither the criterion of functions F6 or F7 is satisfied, then function F10 is performed which merely increments the parameter d, and the next frame is operated on.

FIG. 4 is a plot of typical values $S_d$ as a function of time. In one embodiment, where the accumulator is initialized at zero, the threshold $TH_{out}$ and the threshold $TH_{in}$ lie on either side of the initialized value of $S_d$. The operation of the functions shown in FIG. 3 is represented in FIG. 4 by showing that the value $S_d$ begins increasing until it reaches the threshold $TH_{out}$. At that point (function F9), the value $S_d$ is re-initialized to zero and the process begins again. FIG. 4 shows an instance wherein the value $S_d$ again reaches $TH_{out}$ and is again re-initialized. Thereafter, as shown in FIG. 4, the value $S_d$ reaches the threshold $TH_{in}$ and it is clamped at that point, i.e. it is not allowed to decrease below the threshold $TH_{in}$. In this condition, the parameter In-Synch is now set to unity, i.e. an in-synchronization condition or status is detected. The synchronization detector may detect out-of-synchronization if the value of $S_d$ again reaches $TH_{out}$. If that occurs, the value $S_d$ is reinitialized and synch detection continues.

Selecting the Thresholds

Given the curves shown in FIG. 4, which are exemplary, we can determine the slope, or the average slope, of the curves. Thus, we calculate:

$$M_{in} = S_d/d, \text{ and}$$

$$M_{out} = S_d/d.$$

The mean values $M_{in}$ and $M_{out}$ are fixed for a given decoder with a given non-linear mapping for a given convolutional code. Accordingly, the average time in order to detect an in-synchronization status, $T_{in}$, which is the time interval it takes in order to detect that the decoder is synchronized is given as:

$$T_{in} = TH_{in}/M_{in}.$$

Furthermore, the average time to detect lack of synchronization $T_{out}$ is calculated as:

$$T_{out} = TH_{out}/M_{out}.$$

Both $T_{in}$ and $T_{out}$ are, for a given decoder, with fixed nonlinear mapping and a given convolutional code, determined by the threshold values. As the threshold values decrease or approach each other, the detection time, the time to detect in-synchronization or out-of-synchronization status, is decreased. While this is desirable, another important factor in detection of synchronization is the false alarm rate, i.e. the rate at which the synchronization detector determines an out-of-synchronization status when the decoder is actually synchronized. False alarms can occur at low $E_b/N_o$ ratio circumstances, and results in a loss of a certain amount of information. Desirably the false alarm rate should be maintained as low as possible, for example once a day for a typical range of $E_b/N_o$. Thus, there is a limit toward which we can reduce the distance between the thresholds $TH_{out}$ and $TH_{in}$. In other words, there is a tradeoff between minimizing the time to detect synchronization status and at the same time minimizing the false alarm rates, or at least reducing false alarm rates to practical levels.

On the other hand, the particular non-linear mapping and the particular threshold values depend on the parameters of the various codes which are employed.

Rate ½ Code

For a given rate ½ convolutional code, and in particular one with generator polynomials (171, 133) and constraint length 7, the branch metrics BM and the path metrics PM are determined using 3-bit soft decision detection as opposed to hard decision detection. Accordingly, every received symbol is reflected as three bits of soft decision data, i.e. it is quantized to one of eight levels ranging from 0 to 7. Using the soft decision data, the branch metrics can be calculated from the branch metric formulas:

$$BM_0(t) = J1 + J2$$

$$BM_1(t) = (7 - J1) + J2$$

$$BM_2(t) = J1 + (7 - J2)$$

$$BM_3(t) = (7 - J1) + (7 - J2).$$

The path metric values are calculated as:

$$PM_i(t) = Min(PM_{2i}(t-1) + BM_j(t) - PM_{min}(t-1),$$
$$PM_{2i+1}(t-1) + (14 - BM_j(t)) - PM_{min}(t-1)).$$

If we define $\Delta(t)$ as the difference between $PM_{min}(t) - BM_{min}(t)$, then $\Delta(t)$ can be any non-negative integer less than or equal to 7, i.e. lying between 0 and 7. At the same time, the minimum path metric value $PM_{min}(t)$ also takes nontime, negative integers lying between 0 and 7. The branch metric value $BM_{min}(t)$ can be any non-negative integer less than or equal to 6, i.e. lying between 0 and 6.

In order to optimize the performance of synchronization detection, non-linear mapping of $\Delta(t)$ is required, i.e. $\Delta(t) \rightarrow f(\Delta(t))$. To find optimal non-linear mapping is difficult. However, using the occurrence rate of $\Delta(t)$ sub-optimal nonlinear mapping can be determined.

We use the $S_d$ as the sum of $f(\Delta(t))$. Or in other words:

$$S_d = \sum_{t=1}^{d} f(\Delta(t)).$$

We use two thresholds $TH_{in}$ and $TH_{out}$ as the threshold values for detecting in-synchronization and out-of-synchronization status respectively. If $S_d$ is less than $TH_{in}$, then $S_d$ is reset to the threshold value $TH_{in}$ and the detector continues to add. If $S_d$ is greater than or equal to $TH_{out}$, then an out-of-synchronization status is detected, the search for synchronization is initiated, i.e. the phase of the received bits is slipped or shifted by one, and $S_d$ is reset with an initial value, in one embodiment zero. Synchronization can then be detected if $S_d$ is less than or equal to $Th_{in}$ or, if an in-synchronization status has already been detected, then it is maintained so long as $S_d$ is less than $TH_{out}$. If either of the foregoing conditions are not met, then an out-of-synchronization status or condition is declared. The process begins with an out-of-synchronization status or declaration.

Usually, the rate of occurrences of zero differences between the branch metrics and path metrics when the decoder is in synch is higher than the rate when the decoder is out-of-sync. Based on the foregoing, non-linear mapping of $\Delta(t)$ is determined as:

$$f(\Delta(t)) = \begin{cases} -1, & \text{if } \Delta(t) = 0 \\ \Delta(t), & \text{otherwise.} \end{cases}$$

Using this non-linear mapping for $\Delta(t)$, the mean values $M_{in}$ and $M_{out}$ are calculated from computer simulations. FIG. 5 shows the mean values $M_{in}$ and $M_{out}$ determined by the simulation. An advantage of the non-linear mapping is readily evident from FIG. 5, i.e. the slope of $M_{out}$ is at all times positive whereas, referring to FIG. 1, it can be seen that the problem with the prior art synchronization detection technique is that the slope of the relationship between $S_d$, plotted as a function of $E_b/N_o$, becomes negative above 6.0 dB and significantly negative above 8.0 dB. Furthermore, as the mean values $M_{in}$ and $M_{out}$ increase, the detection times $T_{in}$ and $T_{out}$ become short.

For implementation purposes, the distance between $TH_{in}$ and $TH_{out}$ is determined as 127. Determining that the decoder is in synchronization is more important than determining that the decoder is out of synchronization, and so we select a magnitude of the in-synchronization detection value $TH_{in}$ as further from the of $S_d$ than is the out-of-synchronization detection value $TH_{out}$.

For example, assume that $E_b/N_o$ is 6.0 dB and $TH_{in}$ is $-85$ and $TH_{out}$ is 42. From FIG. 5, $M_{in} = 0.883$ and $M_{out} = 0.654$. The average times for detecting in-synchronization is $T_{in} = -85/-0.883 = 97$ information bits and $T_{out} = 42/0.654 = 65$ information bits.

The false alarm rate can be estimated from the maximum value of $S_d - TH_{in}$ after $S_d$ attains the threshold value $TH_{in}$ for the first time.

Rate ¾ Punctured Convolutional Code

In this case, which is the code derived from the previous rate one-half convolutional code, we change the non-linear mapping so that, in the case where the difference between the path metric and the branch metric is zero, the mapped value is $-1/6$ and if the difference is non-zero, the mapped value is identical to the difference value. FIG. 6 shows the results of computer simulations using the foregoing nonlinear mappings to plot $M_{in}$ and $M_{out}$ vs. $E_b/N_o$. Just as in the case of FIG. 5, FIG. 6 shows that the slope of $M_{out}$ remains positive, thus avoiding the problems which are evident in the prior art synchronization detection technique. As an example, assume that $E_b/N_o$ is 6.25 dB, $TH_{in} = -85$ and $TH_{out} = 42$. We obtain, from FIG. 6, the values for $M_{in} = -0.153$ and $M_{out} = 0.228$. The average detection times are calculated as $T_{in} = -85/-0.153 = 556$ information bits and $T_{out} = 42/0.226 = 186$ information bits.

Rate ⅞ Punctured Convolutional Code

In this case, which is the code derived from the previous one-half convolutional rate, as was the case for the rate ¾ punctured convolutional code, the non-linear mapping is different from the rate ½ case in that if the difference between the path metric and branch metric is zero, the nonlinear mapped value is $-1/16$ and if the difference is nonzero, the non-linear mapped value is equal to the difference. FIG. 7 plots $M_{in}$ and $M_{out}$ vs. $E_b/N_o$. Just as was the case with FIGS. 5 and 6, even at high $E_b/N_o$, $M_{out}$ remains positive. As an example, we assume $E_b/N_o$ of 8.5 dB and $TH_{in} = -85$ and $TH_{out} = 42$. From FIG. 7, $M_{in} = -0.062$ and $M_{out} = 0.115$. The average synch detection times are calculated as $T_{in} = -85/-0.062 = 1371$ information bits and $T_{out} = 42/0.115 = 366$ information bits.

It should be apparent that the absolute value to which parameter $S_d$ is initialized as well as the absolute values of $TH_{in}$ and $TH_{out}$ are unimportant. What is critical is the separation between $TH_{in}$ and $TH_{out}$ from that value to which $S_d$ is initialized. For example, FIG. 4 shows on the axis A that the value to which $S_d$ is initialized is zero. Given that the separation between the initialized $S_d$ and $TH_{in}$ is 85, then $TH_{in} = -85$. Given that the distance between the initialized value $S_d$ and $TH_{out}$ is 42, then $TH_{out}=42$. On the other hand, and as shown on the axis B, we could just as easily provide the initial value of $S_d$ as 85, in which case the absolute value of $TH_{in}$ is zero and the value of $TH_{out}$ is 127. Of course, the three values, the value to which $S_d$ is initialized and $TH_{out}$ and $TH_{in}$, can be moved around at will so long as a given relationship is maintained.

While specific values have been given for the distance between $TH_{out}$ and $TH_{in}$, as well as the distance between the initialized value of $S_d$ and $TH_{out}$ and $TH_{in}$, it should be apparent that these values are illustrative only and furthermore different code parameters would result in different values for the foregoing parameters. It should be apparent from the foregoing that these and other changes can be made within the spirit and scope of the present invention which is to be construed in accordance with the claims attached hereto.

I claim:

1. In a Viterbi decoder, a method of detecting synchronization status using a sequence of differences between minimum path metrics and corresponding minimum branch metrics, said method comprising the steps of:
   a) non-linearly mapping each of said differences into either a first or a second set of mapped values to produce a sequence of mapped values, where a sign of a value in said first set is different from all signs of mapped values in said second set,
   b) summing said sequence of mapped values to produce a sequence of sums, and
   c) comparing each of said sums to a threshold to determine said synchronization status.

2. A method as recited in claim 1 wherein said first set has a single value and said second set has a value with a magnitude identical to a value of a corresponding difference and wherein:
   said comparing step compares said sums to first and second, different, thresholds.

3. A method as recited in claim 2 which includes the further steps of:
   initiating said method by initializing said sum to an initial value,
   in the event any of said sums thereafter reaches said first threshold, determining said synchronization status as out-of-synchronization and re-initializing said sum to said initial value,
   in the event any of said sums reaches said second threshold, determining said synchronization status as in-synchronization and clamping said sum from excursions from said second threshold in a direction away from said initial value.

4. A method as recited in claim 2 including a step of initializing said sum to an initial value, wherein said initial value lies between said first and second thresholds.

5. A method as recited in claim 4 wherein said first threshold is closer to said initial value than said second threshold.

6. A method as recited in claim 5 wherein said first set has a single mapped value with unit magnitude.

7. A method as recited in claim 5 wherein said first set has a single mapped value with magnitude of one sixth.

8. A method as recited in claim 5 wherein said first set has a single mapped value with a magnitude of one sixteenth.

9. In a Viterbi decoder, a method of detecting synchronization status using a sequence of differences between minimum path metrics and corresponding minimum branch metrics, said method comprising the steps of:
   a) non-linearly mapping each of said differences into either a first or a second set of mapped values to produce a sequence of mapped values, wherein a sign of a value in said first set of mapped values is different from all signs of mapped values in said second set,
   b) summing said sequence of mapped values to produce a sequence of sums,
   c) comparing each of said sums to a first and a second, different threshold, and
   d) declaring an out-of-synchronization status if any of said sums are greater than said first threshold or declaring an in-synchronization status if any of said sums are less than said second threshold.

10. A method as recited in claim 9 which includes the further steps of:
    initiating said method by setting an initial sum to an initial value,
    in the event any of said sums thereafter reaches said first threshold, determining said synchronization status as out-of-synchronization and re-initializing said sum to said initial value,
    in the event any of said sums reaches said second threshold, determining said synchronization status as in-synchronization and clamping said sum from excursions from said second threshold away from said initial value.

11. A method as recited in claim 10 wherein said initial value lies between said first and second thresholds.

12. A method as recited in claim 10 wherein mapped values in the second set have magnitudes identical to a corresponding difference.

13. A method as recited in claim 10 wherein said first threshold is closer to said first value than said second threshold.

14. A method as recited in claim 13 wherein said first set has a single mapped value with unit magnitude.

15. A method as recited in claim 13 wherein said first set has a single mapped value with magnitude of one sixth.

16. A method as recited in claim 13 wherein said first set has a single mapped value with magnitude of one sixteenth.

* * * * *